(12) United States Patent
Pattnayak

(10) Patent No.: US 8,698,542 B1
(45) Date of Patent: Apr. 15, 2014

(54) SYSTEM, METHOD, AND COMPUTER PROGRAM PRODUCT FOR PERFORMING LEVEL SHIFTING

(71) Applicant: NVIDIA Corporation, Santa Clara, CA (US)

(72) Inventor: Tapan Pattnayak, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/668,056

(22) Filed: Nov. 2, 2012

(51) Int. Cl.
*H03L 5/00* (2006.01)

(52) U.S. Cl.
USPC .............................. 327/333; 326/62; 326/81

(58) Field of Classification Search
USPC ................... 326/62–63, 80–81; 327/306, 333
See application file for complete search history.

(56) References Cited

U.S. PATENT DOCUMENTS

| 7,151,400 | B2* | 12/2006 | Chen .............................. 327/333 |
| 7,884,643 | B2* | 2/2011 | Wang et al. ..................... 326/68 |
| 2010/0109743 | A1* | 5/2010 | Czech et al. ................... 327/333 |

OTHER PUBLICATIONS

Wang, W.-T. et al., "Level Shifters for High-Speed 1-V to 3.3-V Interfaces in a 0.13-μm Cu-Interconnectio/Low-k CMOS Technology," IEEE, 2001, pp. 307-310.
Koo, K.-H. et al., "A New Level-Up Shifter for High Speed and Wide Range Interface in Ultra Deep Sub-Micron," IEEE, 2005, pp. 1063-1065.
Chavan, A. et al., "Ultra Low Voltage Level Shifters to Interface Sub and Super Threshold Reconfigurable Logic Cells," IEEE, 2008, pp. 1-6.

* cited by examiner

*Primary Examiner* — Dinh T. Le
(74) *Attorney, Agent, or Firm* — Zilka-Kotab, PC

(57) ABSTRACT

A system, method, and computer program product are provided for performing level shifting. In use, level shifting is performed utilizing a native transistor, where the level shifting is performed utilizing a feedback based topology.

16 Claims, 4 Drawing Sheets

SYSTEM, METHOD, AND COMPUTER PROGRAM PRODUCT FOR PERFORMING LEVEL SHIFTING

FIELD OF THE INVENTION

The present invention relates to input/output (I/O) circuitry, and more particularly to performing level shifting utilizing I/O circuitry.

BACKGROUND

Level shifting is an important aspect of input/output (I/) circuitry operation. For example, level shifting may be used to connect a digital circuit that uses a first logic level to another digital circuit that uses another logic level. However, current techniques for performing level shifting have been associated with various limitations.

For example, current methods for performing level shifting may necessitate the use of an analog bias. Additionally, current methods for performing level shifting may suffer from stress and voltage leakage problems. There is thus a need for addressing these and/or other issues associated with the prior art.

SUMMARY

A system, method, and computer program product are provided for performing level shifting. In use, level shifting is performed utilizing a native transistor, where the level shifting is performed utilizing a novel feedback based topology which eliminates a bottom thick gate transistor and uses core level cross coupled transistors to achieve very low core voltage operation.

DETAILED DESCRIPTION

Figure 1:
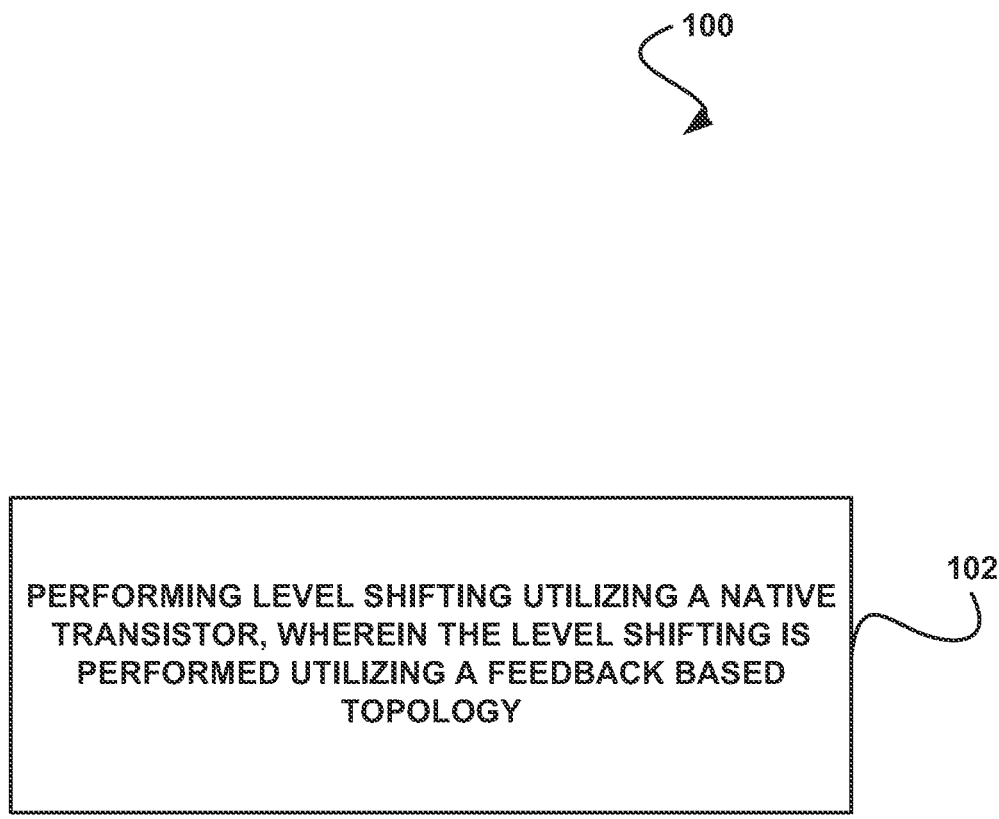
FIG. 1 shows a method for performing level shifting, in accordance with one embodiment.

FIG. 1 shows a method 100 for performing level shifting, in accordance with one embodiment. As shown in operation 102, level shifting is performed utilizing a native transistor, where the level shifting is performed utilizing a feedback based topology. In one embodiment, the level shifting may be performed in association with a circuit. For example, the level shifting may be performed within an input/output (I/O) circuit. In another embodiment, the level shifting may be performed in association with a processor. For example, the level shifting may be performed within a graphics processing unit (GPU), a central processing unit (CPU), etc.

Additionally, in one embodiment, the level shifting may be performed with respect to a signal. For example, performing the level shifting may include repositioning a signal with a predetermined voltage. In another embodiment, the level shifting may be performed by a level shifter that includes the native transistor. In yet another embodiment, the native transistor may include a native metal oxide semiconductor (MOS). For example, the native transistor may include a native MOS with a threshold voltage that is close to zero or that is zero. In another embodiment, the native MOS may be non-symmetric.

Further, in one embodiment, the level shifting may be performed in order to connect a plurality of circuits. For example, the level shifting may be performed to connect a first circuit (e.g., a digital circuit, etc.) that uses a first logic level to a second circuit (e.g., a digital circuit, etc.) that uses a second logic level. In another embodiment, each logic level may represent a state of a signal. For example, each logic level may include one of a finite number of states that a signal (e.g., a voltage signal) may have. In another example, each logic level for a signal may be represented by a voltage difference between the signal and ground.

Further still, in one embodiment, the level shifting may be performed utilizing a stacked design. In another embodiment, the level shifting may be performed utilizing a reduced stack design. For example, the circuit in which the level shifting is performed may not include a thick gate bottom stack. In this way, an area requirement associated with the circuit that performs the level shifting may be reduced. This may also help in reducing a bulk effect on a core thin gate transistor that may helps with switching 10-20 my lower core supply.

Also, in one embodiment, the feedback based topology may include the use of a feedback structure within the circuit that performs the level shifting. For example, the circuit may implement a feedback structure that does not rely on a transient method. See, for example, "A New Level-Up Shifter for High Speed and Wide Range Interface in Ultra Deep Sub-Micron" (Kyoung-hoi koo et al.), which is hereby incorporated by reference in its entirety. Thus this may be less prone to PVT variation.

In another embodiment, an always-present core level signal may be used to program an I/O state of the circuit low and high in a deep power down (DPD) condition without affecting a data path operation for the level shifter. In yet another embodiment, the use of the feedback topology may eliminate a need to add to a stack of devices in a level shifter branch of the circuit, which may optimize area usage within the circuit.

In addition, in one embodiment, the circuit that performs the level shifting may include a bypass mechanism. For example, the circuit may include a bypass mechanism for a data path buffer of the circuit. For example, the bypass mechanism may be used to configure a power down state by a core level signal that does not add any parasitic influence on the data path for timing sanity. In another embodiment, a transistor of the circuit may be pulled down after a first buffer and a weak latch may be used to program a level shifter node high. In yet another embodiment, a weak buffer of the circuit may be active in deep power down mode, which may bypass a strong buffer and thus may eliminate the huge input capacitance in DPD. Thus a level shifter may be provided that may configure DPD level output only by core level signals.

In this way, a circuit that performs the level shifting may be included within a processor to lower the core voltage required by the processor (e.g., the power supply voltage supplied to the processor, etc.). Additionally, the use of a native transistor within the circuit may eliminate the need for any bias during processing. Further, the bias may be made a core level signal instead of an analog signal. Further still, programmability by core level signals may be retained. Also, the use of a stackless design within the circuit may reduce an area of a level shifter, as a thin gate may not have body effect. Thus the switching may be pushed to 20-30 my less core supply voltage.

Additionally, the proposed feedback methodology may reduce area by using a fewer number of fingers of native devices, which are not only bulky, but may also require large spacing distance in between them. Further, limiting the number of figures may reduce an area requirement (e.g., by more than 50%, compared to a no feedback based topology for native level shifters, etc.).

Further still, this innovation may eliminate the stress on the core transistor without adding a second pair of transistor stacks to a Native device for the condition when a native device may have a negative threshold voltage. Also, the proposed methodology may also program an output of the level up shifter in deep power down (DPD) mode by using core level DPD control signals. The proposed buffer bypass methodology in DPD may not add any parasitic data to the data path by adding DPD controllability, which may facilitate high speed operation. In addition, the feedback may eliminate stress and leakage and may also enable very low core voltage operation.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
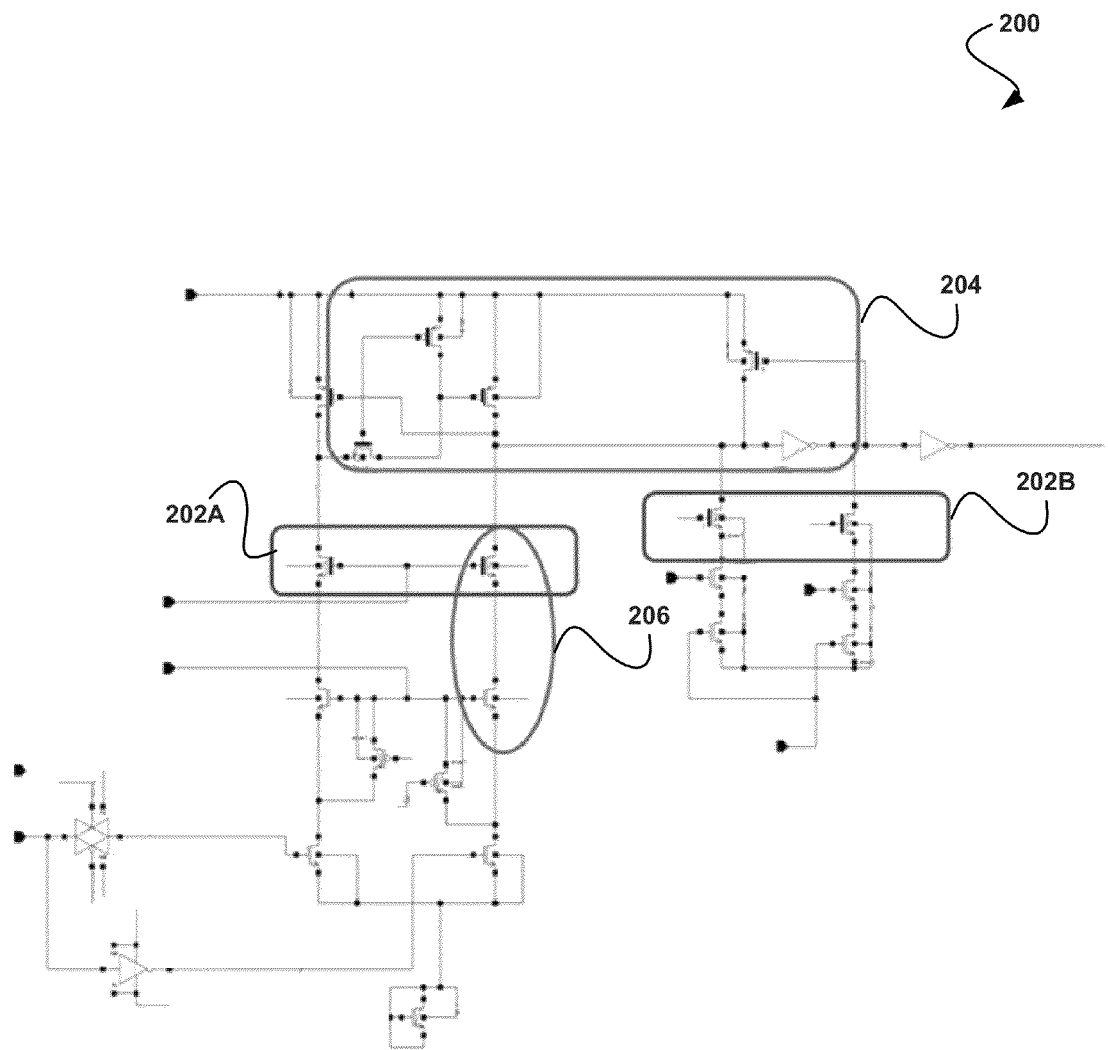
FIG. 2 shows exemplary input/output circuitry, in accordance with another embodiment.

FIG. 2 shows exemplary input/output circuitry 200, in accordance with another embodiment. As an option, the circuitry 200 may be carried out in the context of the functionality of FIG. 1. Of course, however, the circuitry 200 may be implemented in any desired environment. It should also be noted that the aforementioned definitions may apply during the present description.

As shown, the exemplary input/output circuitry 200 includes native based level shifters 202A and 202B. Additionally, the exemplary input/output circuitry 200 includes a feedback structure 204 and a native stack 206. In one embodiment, each of the native based level shifters 202A and 202B may include a native MOS. In another embodiment, a stack of the input/output circuitry 200 may be removed. In this way, an area requirement of the native based level shifters 202A and 202B may be reduced. Additionally, the use of a native MOS may eliminate analog bias and may reduce stress in the level shifters 202A and 202B. See, for example, "Level Shifter for High-Speed 1-V to 3.3-V interfaces in a 0.13-um Cu-interconnection/Low-k CMOS technology" (Wen-Tai Wang et al.), "A New Level-Up Shifter for High Speed and Wide Range Interface in Ultra Deep Sub-Micron" (Kyoung-hoi koo et al.), and "Ultra Low Voltage Level Shifters to Interface Sub and Super Threshold Reconfigurable Logic Cells" (Ameet Chavan et al.), which are hereby incorporated by reference in their entirety.

Additionally, in one embodiment, the feedback structure 204 of the exemplary input/output circuitry 200 may eliminate a reliance on a transient method, and may not add any more stack to the stack of devices in the level shifter branch of the exemplary input/output circuitry 200. In this way, area may be optimized. In another embodiment, the feedback structure 204 of the exemplary input/output circuitry 200 may use an "always on core" level signal to program a state of the exemplary input/output circuitry 200 both high and low in a core power down condition, without affecting a data path operation for the native based level shifters 202A and 202B.

In this way, the native based level shifters 202A and 202B may enable the exemplary input/output circuitry 200 to function at a very low core voltage (e.g., a core voltage of 0.57V-3.6V, etc.) level shifting, where such level shifting does not require any bias. Additionally, low core supply operation may be possible for the exemplary input/output circuitry 200 while utilizing a small level shifter area. Further, programmability by core level signals may be retained.

Figure 3:
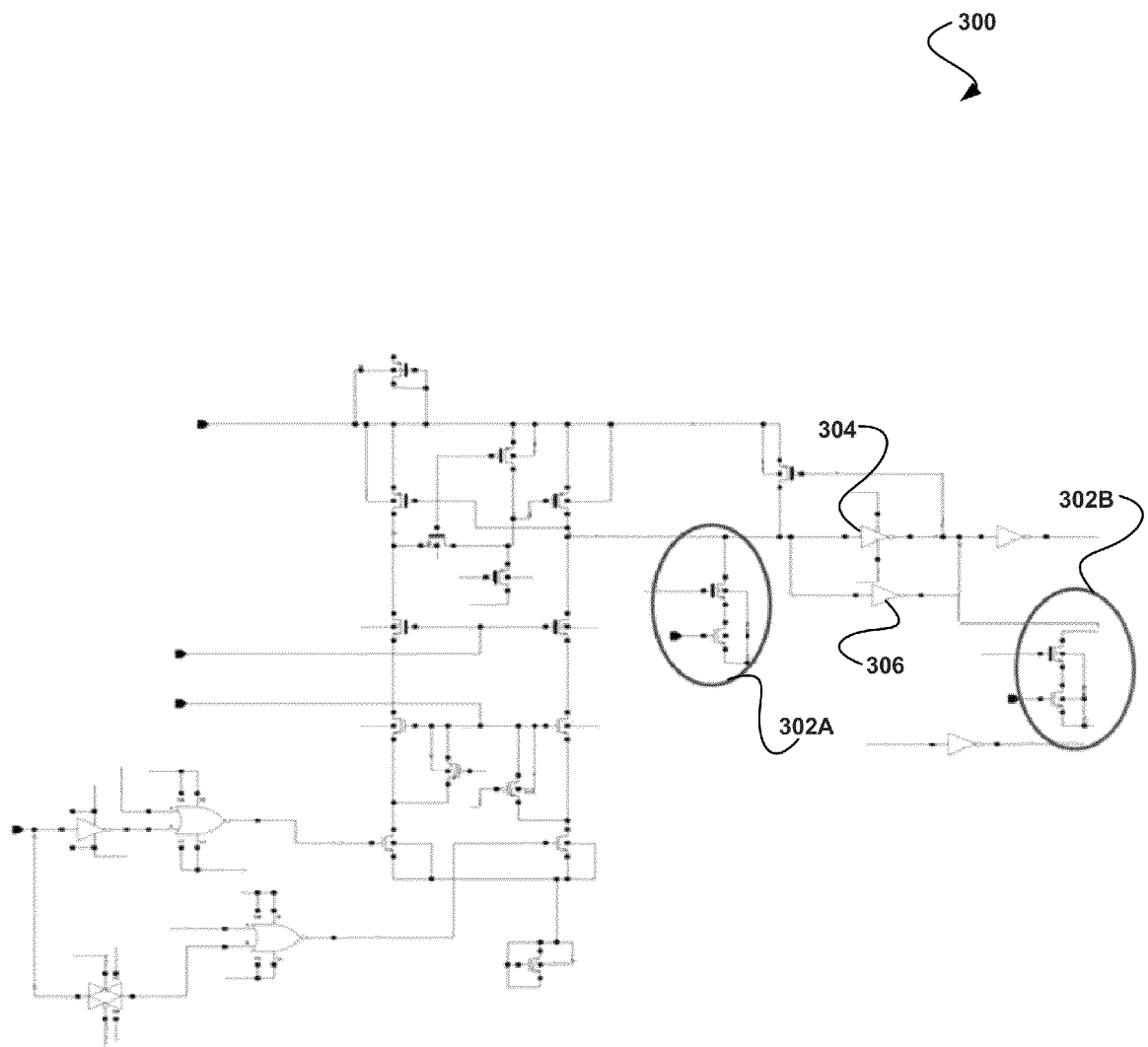
FIG. 3 shows exemplary deep power down input/output circuitry, in accordance with another embodiment.

FIG. 3 shows exemplary deep power down input/output circuitry 300, in accordance with another embodiment. As an option, the circuitry 300 may be carried out in the context of the functionality of FIGS. 1-2. Of course, however, the circuitry 300 may be implemented in any desired environment. It should also be noted that the aforementioned definitions may apply during the present description.

As shown, the exemplary deep power down input/output circuitry 300 includes native based level shifters 302A and 302B. In one embodiment, programmability in the exemplary deep power down input/output circuitry 300 may be either low or high. In another embodiment, one of the native based level shifters 302A may always be high except for switching purposes. In another embodiment, the native based level shifters 302A and 302B may pull down the signal within the exemplary deep power down input/output circuitry 300 after a first buffer and may use a weak latch to program a level shifter node high.

Additionally, in one embodiment, a data path buffer 304 of the exemplary deep power down input/output circuitry 300 may be bypassed, and a weak buffer 306 of the exemplary deep power down input/output circuitry 300 may be activated in deep power down mode. In another embodiment, a weak P-type metal-oxide-semiconductor (PMOS) may be altered when a core level signal is pulling a node low.

Figure 4:
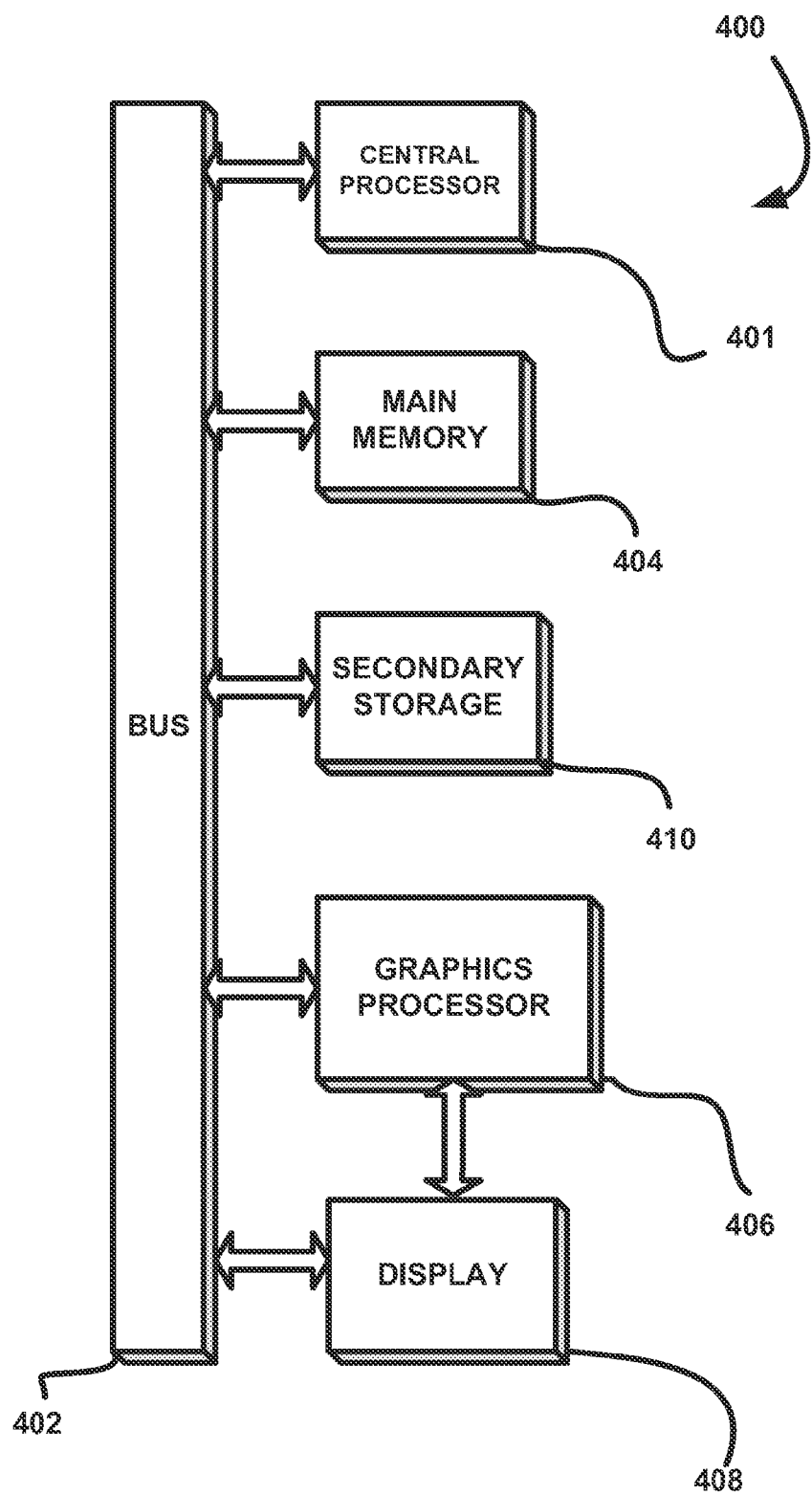
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The system 400 also includes a main memory 404. Control logic (software) and data are stored in the main memory 404 which may take the form of random access memory (RAM).

The system 400 also includes a graphics processor 406 and a display 408, i.e. a computer monitor. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The system may also be realized by reconfigurable logic which may include (but is not restricted to) field programmable gate arrays (FPGAs).

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, and/or any other type of logic. Still yet, the system 400 may take the form of various other devices m including, but not limited to a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A circuit, comprising:
   a first native based level shifter sub-circuit coupled between an input stage and an output of the circuit;
   a second native based level shifter sub-circuit connected to said output; and
   a feedback structure sub-circuit connected to said output and configured to receive an input voltage signal and generate a level-shifted output voltage signal at said output to reduce transient, the feedback structure sub-circuit comprising:
      a first transistor having a source terminal coupled to the input voltage signal and a drain terminal coupled to the first native based level shifter:
      a second transistor having a source terminal coupled to the input voltage signal and a drain terminal coupled to both the first native based level shifter and the second native based level shifter sub-circuit;
      a third transistor having a source terminal coupled to the input voltage signal and a drain terminal coupled to the gate terminal of the second transistor; and
      a fourth transistor coupled between the drain terminal of the first transistor and the drain terminal of the third transistor, and having a gate that is coupled to a gate of the third transistor.

2. The circuit of claim 1, wherein the level-shifted output voltage signal is a power supply voltage.

3. The circuit of claim 1, wherein the input voltage signal is a core voltage.

4. The circuit of claim 2, wherein the input voltage is shifted from 0.57 to 3.6 volts.

5. The circuit of claim 1, wherein the first native based level shifter sub-circuit comprises a native metal oxide semiconductor (MOS) transistor.

6. The circuit of claim 5, wherein a threshold voltage of the native MOS transistor is zero.

7. The circuit of claim 1, further comprising an additional native transistor that is coupled to the first native based level shifter sub-circuit to form a transistor stack.

8. The circuit of claim 1, wherein the first native based level shifter sub-circuit is configured to receive a power down control signal at a core voltage level.

9. A system, comprising:
   an input/output (I/O) circuit comprising:
      a first native based level shifter sub-circuit coupled between an input stage and an output of the circuit;
      a second native based level shifter sub-circuit connected to said output; and
      a feedback structure sub-circuit connected to said output and configured to receive an input voltage signal and generate a level-shifted output voltage signal at said output to reduce transient, the feedback structure sub-circuit comprising:
         a first transistor having a source terminal coupled to the input voltage signal and a drain terminal coupled to the first native based level shifter;
         a second transistor having a source terminal coupled to the input voltage signal and a drain terminal coupled to both the first native based level shifter and the second native based level shifter sub-circuit;
         a third transistor having a source terminal coupled to the input voltage signal and a drain terminal coupled to the gate terminal of the second transistor, and
         a fourth transistor coupled between the drain terminal of the first transistor and the drain terminal of the third transistor, and having a gate that is coupled to a gate of the third transistor.

10. The system of claim 9, wherein the I/O circuit resides within a graphics processing unit (GPU).

11. The system of claim 9, wherein the level-shifted output voltage signal is a core voltage.

12. The system of claim 11, wherein the core voltage is 0.57-3.6 volts.

13. The system of claim 9, wherein the input voltage signal is a power supply voltage.

14. The system of claim 9, wherein the first native based level shifter sub-circuit comprises a native metal oxide semiconductor transistor.

15. The system of claim 14, wherein a threshold voltage of the native metal oxide semiconductor transistor is zero.

16. The system of claim 9, wherein the I/O circuit further comprises an additional native transistor that is coupled to the first native based level shifter sub-circuit to form a transistor stack.

* * * * *